United States Patent [19]

Miyazima

[11] Patent Number: 4,466,565

[45] Date of Patent: Aug. 21, 1984

[54] WIRE BONDING APPARATUS FOR SEMICONDUCTOR DEVICE

[75] Inventor: Kenzi Miyazima, Kawasaki, Japan

[73] Assignee: Tokyo Shibaura Denki Kabushiki Kaisha, Japan

[21] Appl. No.: 423,091

[22] Filed: Sep. 24, 1982

[30] Foreign Application Priority Data

Sep. 25, 1981 [JP] Japan .............................. 56-150769

[51] Int. Cl.$^3$ .............................................. B23K 1/06
[52] U.S. Cl. ......................................... 228/1 B; 228/9
[58] Field of Search .................... 228/1 R, 1 B, 4.5, 9

[56] References Cited

U.S. PATENT DOCUMENTS 3,212,695 10/1965 MacGregor ..................... 228/1 R
3,357,090 12/1967 Tiffany ................................. 228/1

FOREIGN PATENT DOCUMENTS 423592 10/1974 U.S.S.R. ................................. 228/1

Primary Examiner—Nicholas P. Godici
Assistant Examiner—Thomas S. Mieczkowski
Attorney, Agent, or Firm—Finnegan, Henderson, Farabow, Garrett & Dunner

[57] ABSTRACT

At least first and second ultrasonic horns are coupled to one capillary in a state wherein a prescribed angle is defined therebetween. In accordance with the angle defined by a straight line connecting a pad on a semiconductor pellet and a corresponding inner lead of a lead frame with respect to a prescribed direction, control is made of the amounts of ultrasonic wave energy to be applied to the first and second ultrasonic horns. The bonding portion is bonded by the capillary in accordance with a composite vector of those vectors corresponding to the energies supplied to the first and second ultrasonic horns.

2 Claims, 4 Drawing Figures

WIRE BONDING APPARATUS FOR SEMICONDUCTOR DEVICE

BACKGROUND OF THE INVENTION

This invention relates to a wire bonding apparatus for a semiconductor device. More particularly, the invention is concerned with an ultrasonic wire bonding apparatus.

The assembling process for a semiconductor device includes the step of connecting a bonding wire at one end to a pad of the semiconductor pellet and at the other end to an inner lead of the lead frame. Conventionally, a thermal compression bonding was used to bond the bonding wire onto the pad and the inner lead of the lead frame. In this method, it was necessary to heat the bonding portion up to a temperature of 200° C. to 350° C. For this reason, gold was used for the bonding wire, and the lead frame was gold plated. This resulted in an increase in the manufacturing cost of the semiconductor device. On the other hand, for the purpose of reducing the manufacturing cost, an aluminum wire is used as the bonding wire and the lead frame is given a thin gold-plating. This method of decreasing the plating thickness, however, results in a decrease in the bonding strength to the lead frame. To decrease the heating temperature for the bonding portion down to 100° C. from 200° C., an attempt to use an ultrasonic bonding concurrently with the thermal compression bonding was made with respect to the above-mentioned bonding operation. This attempt, however, failed to entirely eliminate the gold-plating for the lead frame. Further, to ensure the low manufacturing cost of the semiconductor device, nickel, iron or tin is plated onto the lead frame, instead of gold for carrying out the ultrasonic bonding. However, since the ultrasonic bonding is effective only in the direction in which the ultrasonic waves oscillate, a conventional bonding apparatus having a single ultrasonic horn coupled to a capillary was unsuitable as the bonding apparatus for complicated semiconductor devices. For example, a semiconductor pellet 2 including an integrated circuit 1 shown in FIG. 2 includes a plurality of pads 3 arranged in the direction A and a plurality of pads 4 arranged in direction B. On the other hand, a lead frame 5 having the semiconductor pellet 2 loaded thereon includes a plurality of inner leads 6 arranged in the direction A and extending in the direction B, and a plurality of inner leads 7 arranged in the direction B and extending in the direction A. Each pad is connected by a bonding wire 8 to an inner lead of the lead frame corresponding in position to the pad. The direction in which the bonding wire 8 is arranged, however, is kept to define a specified angle with respect to a prescribed reference direction. Therefore, when an attempt is made to bond the bonding wire 8 onto every bonding portion by using the bonding apparatus having a single ultrasonic horn effective only in one oscillating direction, it is necessary that the lead frame 5 and the ultrasonic horn of the bonding apparatus be rotated relatively through a wide angular range. Accordingly, it was extremely difficult to automate the bonding operation for a semiconductor device. To briefly explain by way of example, the prior art ultrasonic bonding apparatus necessitates the use of rotating means and displacing means. The former means is designed to rotate the members to be bonded, or the lead frame 5 having the semiconductor pellet 2 loaded thereon at a preselected position, so that a bonding portion thereof is positioned in a prescribed direction. The latter means is designed to displace the capillary having the bonding wire 8 in the X and Y directions to guide the same up to the bonding portion positioned in said prescribed direction. However, these rotating and displacing means are not simple in construction and therefore are not suitable for automation.

SUMMARY OF THE INVENTION

The object of the invention is to provide a wire bonding apparatus for a semiconductor device wherein at least two ultrasonic horns of which the oscillation directions are different from each other are coupled to a single capillary, and the ultrasonic energies to be supplied to the ultrasonic horns are changed relatively according to the positions of bonding portions whereby to cause the capillary to oscillate in accordance with a vector sum of vectors corresponding to the energies supplied to the ultrasonic horns.

According to the invention, there is provided a wire bonding apparatus for a semiconductor device comprising a plurality of oscillators; a plurality of ultrasonic wave energy supplying means each including an ultrasonic wave producing element for producing an amount of ultrasonic wave energy corresponding to the output of the oscillator and ultrasonic horn driven by the output of the ultrasonic wave producing element to oscillate in a prescribed direction; a capillary for bonding a lead wire by means of ultrasonic bonding onto an inner lead of a lead frame and onto a corresponding pad of a semiconductor pellet loaded on the lead frame; coupling means for coupling the ultrasonic horns of the plurality of ultrasonic wave energy supplying means to the capillary so as to permit one of the ultrasonic horns to define a prescribed angle with respect to the other; and means for driving the oscillators so that the amounts of ultrasonic wave energy supplied to the ultrasonic horns may be varied relative to each other in accordance with an angle of a bonding wire for connecting an inner lead of the lead frame and a corresponding pad of the semiconductor pellet, the angle of the bonding wire being defined by the extending direction of the bonding wire and a prescribed direction.

DETAILED DESCRIPTION OF THE PREFERRED EMBODIMENT

Figure 1:
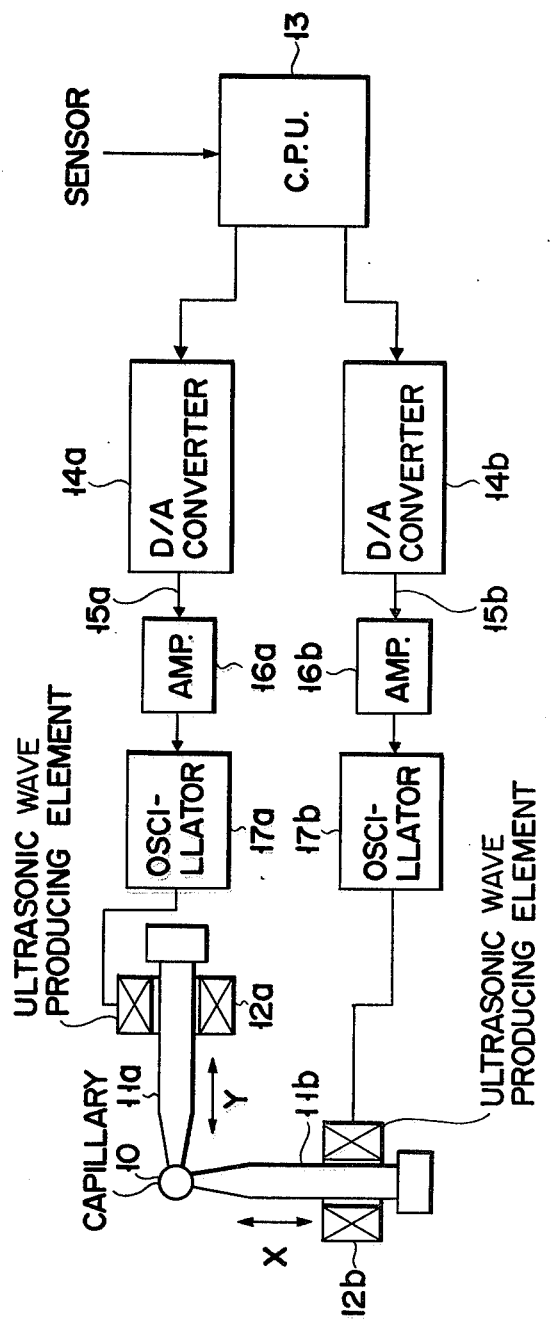
FIG. 1 is a block diagram explaining the principle of an embodiment of the invention.
Figure 2:
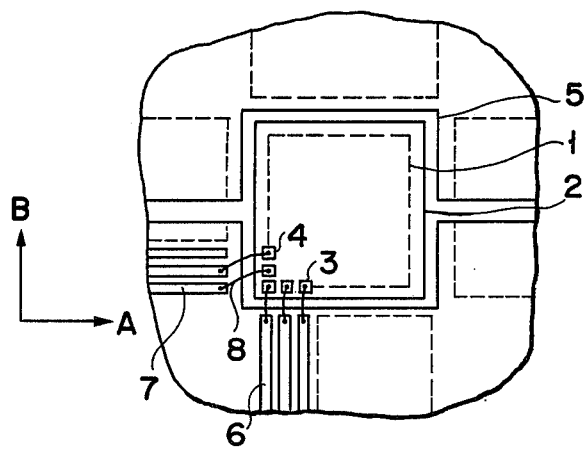
FIG. 2 is a plan view associated with a semiconductor pellet in relation to a lead frame, showing the bonding portions to be bonded by the wire bonding apparatus shown in FIG. 1.

In FIG. 1, to a capillary 10 for effecting the ultrasonic bonding explained before in connection with FIG. 2 there is coupled one end of each of ultrasonic horns 11a and 11b, which according to this embodiment intersect at right angles to each other. The horn 11a is driven, by the output of the ultrasonic wave producing element 12a, to oscillate in the Y direction. The horn 11b is driven by the output of the ultrasonic wave producing element 12b to oscillate in the X direction. A bonding wire to be bonded by the capillary 10, for example, an aluminum wire, is not shown. The digital data from CPU (Central Processor Unit) 13 is converted by D/A converters 14a and 14b into analog signals 15a and 15b. The analog signal 15a is applied to the ultrasonic wave producing element 12a through an amplifier 16a and an oscillator 17a. Thus, the ultrasonic horn 11a is allowed to oscillate in the Y direction. The analog signal 15b is applied to the ultrasonic wave producing element 12b through an amplifier 16b and an oscillator 17b. Thus, the horn 11b is allowed to oscillate in the X direction. Thus, the capillary 10 oscillates in accordance with a composite vector of those vectors corresponding to the X direction and Y direction oscillations of the horns 11b and 11a. The positional relationship between the ultrasonic wave producing elements 12a, 12b, ultrasonic horns 11a, 11b, and capillary 10 is shown in FIGS. 3 and 4.

Figure 3:
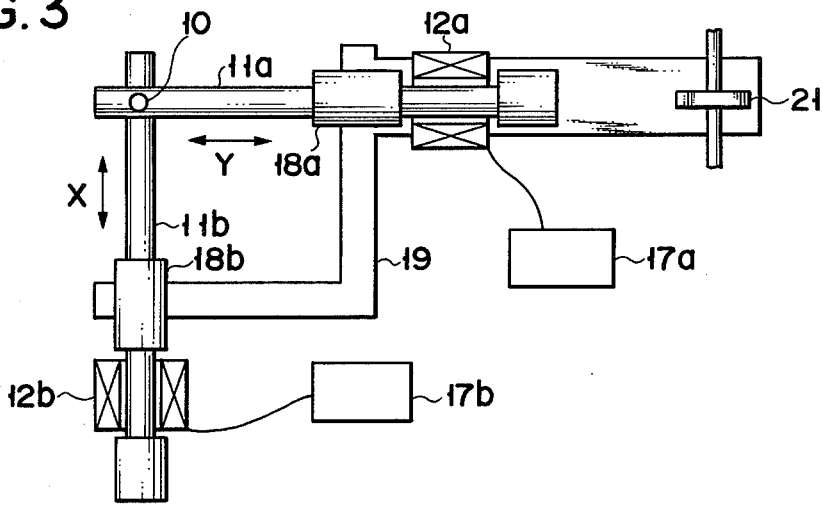
FIG. 3 is a plan view showing a mechanical oscillation section of the embodiment shown in FIG. 1.
Figure 4:
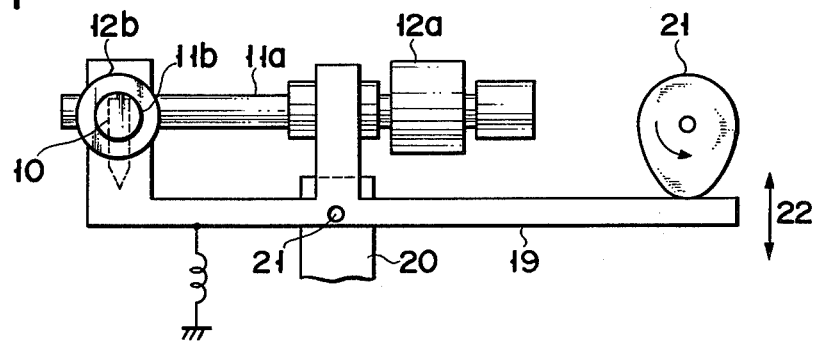
FIG. 4 is a front elevational view of FIG. 3.

In FIGS. 3 and 4, the ultrasonic horn 11a is retained by a member 18a so that it may slide in the Y direction, while the horn 11b is retained by a member 18b so that it may slide in the X direction. The members 18a, 18b are retained by a retainer member 19. The retainer member 19 is retained by a stationary member 20 so that it may be rotatable about a pin 21 fixed on the stationary member 20. A free end of this retainer member 19 is displaced by a cam 21 in the directions indicated by the illustrated arrows 22. Accordingly, in accordance with the angle of rotation of the cam 21, a tip end of the capillary 10 is pressed onto a bonding portion, thereby carrying out the bonding operation. Upon completion of the bonding operation with respect to this bonding portion, that tip end of the capillary 10 is displaced to another bonding portion. In accordance with the positions of the bonding portions, the capillary is displaced relative to the lead frame, or vice versa.

The operation of the wire bonding apparatus according to the invention will now be described. The present wire bonding apparatus is the same as in the prior art in that the capillary 10 is displaced relative to the lead frame 5 having a semiconductor pellet 2 loaded thereon, or vice versa. When an assembled member or a lead frame 5 carrying the semiconductor pellet 2 thereon reaches a bonding position of the bonding apparatus, the pellet 2 is positioned relative to the lead frame 5. This positioning is effected by positioning two bonding pads (reference pads) located at the ends of one diagonal of the pellet 2 respectively to prescribed positions of the lead frame. The CPU 13 includes a memory, arithmetic operation section, and control section. The positions of pads 3, 4 of the pellet 2 are previously stored in the memory of CPU 13 in the form of coordinates. Accordingly, the positions of the remaining pads relative to the reference pads are calculated by CPU 13 from the coordinates of the reference pads. Further, the angle defined by a straight line or bonding wire 8 connecting one pad 3 or 4 to be bonded and a corresponding inner lead 6 or 7 of the lead frame with respect to a prescribed direction, for example, the angle of the bonding wire 8 with respect to Y axis is calculated, within CPU 13, from the data stored in the memory. In this invention, in accordance with this angle calculated by CPU 13 in regard to each individual pad, control is made of the ratio between the amounts of ultrasonic wave energy supplied from the horns 11a and 11b to the capillary 10. In accordance with a composite vector of the two vectors corresponding to the energies supplies to the horns, the capillary 10 is allowed to oscillate with a prescribed strength and in prescribed direction, thereby carrying out the bonding operation. Assume by way of example that the bonding angle (an angle defined by the bonding wire 8 connecting the pad and the corresponding inner lead with respect to the Y axis) at which the bonding wire 8 is in coincidence with the (+) Y axis be 0°; the bonding angle at which the bonding wire 8 is in coincidence with the (−) Y axis be 180°; the bonding angle at which the bonding wire 8 is in coincidence with the (−) X axis be 90°; and the bonding angle at which the bonding wire 8 is in coincidence with the (+) X axis be 270°. In this case, the relationship between the amounts of ultrasonic wave energy supplied to the horns 11a, 11b is controlled by CPU 13 as follows.

a. When the bonding angle is 0° or 180°, the ultrasonic wave energy is applied by only the ultrasonic wave horn 11a, b. When the bonding angle is 90° or 270°, the ultrasonic wave energy is applied by only the ultrasonic wave horn 11b, c. When the bonding angle is 45°, 135°, 225°, or 315°, an ultrasonic wave energy equal to approximately 65% of the rated ultrasonic wave energy is applied by each of the ultrasonic horns 11a and 11b.

The programs for determining, in accordance with the bonding portions, the amounts of ultrasonic wave energy to be supplied to the horns 11a and 11b are previously stored in the memory of CPU 13. What should be noted here is that the timing with which the ultrasonic wave energy is applied to the horns 11a, 11b is to be so determined that, in accordance with a composite vector of those vectors corresponding to the energies supplied to the ultrasonic horns 11a and 11b, a desired amount of ultrasonic wave energy may be given to the capillary 10 in a desired direction. This determination can be made by the programs stored in CPU 13. The timing with which the bonding operation for a prescribed position is started or completed is detected by the use of a sensor not shown, thereby controlling the operation timing for CPU.

Since, according to the invention, the capillary 10 is given an ultrasonic wave energy directed in accordance with the bonding angle defined by the bonding wire with respect to a prescribed direction, it is possible to lessen the amount of displacement of the lead frame 5 relative to the bonding apparatus. This is not only advantageous for automating the bonding operation, but also enables a precise bonding to be achieved. Further, the invention makes it unnecessary to use gold or the like for the lead frame or bonding wire, and at the same time makes it possible to carry out the bonding operation at a low temperature. According to the invention, the ultrasonic wave horns are not limited to two in number.

What is claimed is:

1. A wire bonding apparatus for a semiconductor device, comprising:
   a plurality of oscillators;
   a plurality of ultrasonic wave energy supplying means each including an ultrasonic wave producing element for producing an amount of ultrasonic wave energy corresponding to the output of said oscillator and an ultrasonic horn driven by the output of said ultrasonic wave producing element to oscillate in a prescribed direction;
   a capillary for bonding a bonding wire by means of ultrasonic bonding onto an inner lead of a lead frame and onto a corresponding pad of a semiconductor pellet loaded on said lead frame;

means for inputting location data representative of said inner lead and corresponding pad;

coupling means for coupling said ultrasonic horns of said plurality of ultrasonic wave energy supplying means to said capillary so as to permit one of said ultrasonic horns to define a prescribed angle with respect to the other;

means for determining an angle of bonding in response to said inner lead location data and said corresponding pad location data, said angle of bonding being defined as the angle formed by said bonding wire and a predetermined reference axis; and means for driving said oscillators so that the amounts of ultrasonic energy supplied to said ultrasonic horns may be varied relative to each other in accordance with said angle of bonding.

2. A wire bonding apparatus for a semiconductor device according to claim 1, wherein said coupling means includes means for coupling first and second ultrasonic horns to said capillary so as to define an angle of 90 degrees therebetween.

* * * * *